(12) United States Patent
Gerling et al.

(10) Patent No.: US 9,767,995 B2
(45) Date of Patent: Sep. 19, 2017

(54) PLASMA TREATMENT DEVICE AND METHOD FOR PLASMA TREATMENT

(71) Applicant: INP Greifswald e.V., Greifswald (DE)

(72) Inventors: Torsten Gerling, Greifswald (DE); Norbert Lembke, Greifswald (DE); Klaus-Dieter Weltmann, Ostseebad Binz (DE)

(73) Assignee: Leibniz-Institut fuer Plasmaforschung und Technologie e.V., Greifswald (DE)

( * ) Notice: Subject to any disclaimer, the term of this patent is extended or adjusted under 35 U.S.C. 154(b) by 0 days.

(21) Appl. No.: 15/008,488

(22) Filed: Jan. 28, 2016

(65) Prior Publication Data
US 2016/0225589 A1 Aug. 4, 2016

(30) Foreign Application Priority Data
Jan. 29, 2015 (DE) .......... 10 2015 101 315

(51) Int. Cl.
*H01J 7/24* (2006.01)
*H05B 31/26* (2006.01)
*H01J 37/32* (2006.01)
*H05H 1/48* (2006.01)

(52) U.S. Cl.
CPC ......... *H01J 37/32532* (2013.01); *H05H 1/48* (2013.01); *H05H 2001/486* (2013.01)

(58) Field of Classification Search
CPC .......... H05H 1/46; H05H 1/24; H05H 1/2406; H05H 1/34; H05H 2001/2412; H01J 37/32082; H01J 37/3244; C23C 16/511

USPC ....................... 315/111.21, 231.31
See application file for complete search history.

(56) References Cited

U.S. PATENT DOCUMENTS

| | | | | |
|---|---|---|---|---|
| 2005/0164028 A1* | 7/2005 | Reich-Sprenger | .... | C23C 14/046 428/660 |
| 2006/0152163 A1* | 7/2006 | Miki | ..... | F01N 3/0892 315/111.21 |
| 2014/0217881 A1* | 8/2014 | Nam | ..... | C23C 16/509 313/231.31 |
| 2015/0366042 A1* | 12/2015 | Zaidi | ..... | H05H 1/2406 315/111.21 |

FOREIGN PATENT DOCUMENTS

| | | |
|---|---|---|
| CN | 101778525 A | 7/2010 |
| DE | 10 2006 019 664 A1 | 10/2007 |
| DE | 10 2009 028 190 A1 | 2/2011 |
| DE | 10 2009 047 220 A1 | 6/2011 |
| DE | 11 2011 105 333 T5 | 3/2014 |
| DE | 10 2013 000 440 A1 | 7/2014 |
| FR | 2 763 778 A1 | 11/1998 |
| FR | 2 775 864 A1 | 9/1999 |

* cited by examiner

*Primary Examiner* — Alexander H Taningco
*Assistant Examiner* — Christian L Garcia
(74) *Attorney, Agent, or Firm* — Whitham, Curtis & Cook, P.C.

(57) ABSTRACT

A plasma treatment device having an electrode arrangement (3) for generating a plasma in a supplied gas stream. The electrode arrangement has at least one movably mounted electrode. The plasma is preferably a cold atmospheric pressure plasma and can be generated so as to vary in location by means of movement of the at least one electrode.

6 Claims, 4 Drawing Sheets

PLASMA TREATMENT DEVICE AND METHOD FOR PLASMA TREATMENT

FIELD OF THE INVENTION

The invention relates to a plasma treatment device, having an electrode arrangement for generating a plasma, in particular a cold atmospheric-pressure plasma.

The invention additionally relates to a method for plasma treatment of a surface by means of such a plasma treatment device.

BACKGROUND

Besides solid, liquid and gaseous, plasma is the fourth state of aggregation of matter. It can be used, in the form of a low-temperature plasma, as at least partially ionized gas, for numerous applications for treating surfaces. Thus, surface activation is conceivable, but so too is surface cleaning, owing to the disinfecting/sterilizing action of low-temperature plasma.

DE 10 2006 019 664 A1 describes a cold-plasma handheld device for plasma treatment of surfaces. A high-voltage unit, having an adaptation network for generating the high voltage required for producing plasma, is built into a handle, or handheld casing. A process gas is routed through the high-voltage unit. The plasma jet that is produced after passage through the high-voltage generator is driven outward by the gas stream, and emerges in a relatively highly focused manner. In order to widen the plasma stream, the plasma nozzle can be widened and provided with a slot.

DE 10 2009 028 190 A1 discloses a plasma handheld device having an integrated high-frequency generator, and having a gas inlet for supplying process gas. Again, a plasma jet, driven by the process gas, emerges from a nozzle at the outside-face end of the plasma handheld device. Since the plasma nozzle, the high-voltage source and a high-frequency generator are integrated into the easily handled plasma tool, the spurious electromagnetic radiation is reduced. For differing plasma beams, various types of electrode may be provided, such as needle-shaped electrodes, blade-shaped electrodes, or a plurality of needle-shaped electrodes arranged next to each other.

DE 10 2009 047 220 A1 describes an appliance and a method for generating a pulsed, cold atmospheric-pressure plasma for antimicrobial plasma treatment (sanitization, disinfection, sterilization, decontamination) of extremely small surfaces and cavities, with pinpoint precision. A process gas is introduced into a handheld device via a gas inlet, and routed through a high-voltage electrode for the purpose of ionization. The electrically conductive object to be treated serves as a counter-electrode. In order to enlarge the receiving plane, a parallel circuit of a plurality of electrodes can be provided for the purpose of upscaling.

CN 101778525 A describes a pneumatically rotatable air plasma jet source, in which a plasma jet flows out of a rotatable, obliquely oriented nozzle.

SUMMARY

Proceeding therefrom, it is an object of the present invention to create an improved plasma treatment device and an improved method for plasma treatment of a surface by means of such a plasma treatment device, in which the surface area receiving the plasma jet is enlarged and the treatment time is thereby reduced, with the structure and handling being as simple as possible.

It is proposed that the electrode arrangement of the plasma treatment device have at least one movably mounted electrode, and the plasma can be generated so as to vary in location, by means of movement of the at least one electrode.

The ignition region between the effectively active portion of the moving electrode and a counter-electrode, which may also be an electrically conductive object to be treated, can be varied continuously as a result of the continuous, automatic movement of the at least one electrode. Thus, with the plasma treatment device oriented in an unchanging manner onto the surface to be treated, the surface area that receives the stream of plasma gas and that is thereby treated is thus enlarged, the as compared with the stationary electrode in the case of a stationary plasma treatment device.

Whereas, in the prior art, the surface area receiving the stream of plasma gas is enlarged by widening of the nozzle head, e.g. by means of a slot or by parallel connection with associated nozzles, or by movement of the nozzle head, the present invention proposes a driven movement of the electrode arrangement. Thus, with the plasma treatment device oriented in a stationary manner onto the surface to be treated, the surface area receiving the generated plasma stream is thus already enlarged the instant the ignition spark is generated, and not as a result of a subsequent orientation of the stream of plasma gas. This has the advantage that a plasma generated in a gas stream that is passed through can easily act upon the gas stream over a large area as it flows through.

This, however, does not preclude the outflowing stream of plasma gas from also additionally being distributed further, for example by a rotating nozzle head.

The electrode may be moved in a linear manner, in a rotatory manner, with a plurality of superimposed movement directions, or in another appropriate manner.

The movably mounted electrode is preferably the electrode to which high-voltage potential is applied, and that is disposed adjacently to a counter-electrode connected to frame potential. This counter-electrode may be part of the electrode arrangement in the plasma treatment device. It is also conceivable, however, for the counter-electrode to be constituted by the surface to be treated. The conductive counter-electrode may thus be constituted, for example, by a fluid such as, for example, water.

In a preferred embodiment, which is very easy to handle, the electrode arrangement preferably has a rotatably disposed cylinder. The at least one electrode is then realized as a conductor path or conductor wire disposed in the form of a spiral on the cylinder. The conductor path may be, for example, materially bonded to the cylinder surface. It is also conceivable, however, for a conductor wire or an electrically conductive strip of material to be wound around the surface of the cylinder. Disposed on the cylinder is also understood to mean, however, that the conductor paths or the conductor wire are immersed in the cylinder, at least partially. It is thus conceivable for the cylinder to have at least one groove, wound in the form of a spiral, in which an electrically conductive conductor path or such a conductor wire is inserted.

Owing to the rotation of the cylinder that carries the conductor path or conductor wire in the form of a spiral, the ignition region between a point on the conductor path, or conductor wire, and the nearest region of the counter-electrode, respectively, is altered continuously in its position. This has the result that the ignition sparks produced when high-voltage potential is applied to the at least one electrode shift continuously as the cylinder rotates, and change their location. Consequently, in the case of a plasma treatment device that is fixed relative to the treating surface, for example if the surface to be treated constitutes the counter-electrode, a larger surface area is treated by the generated plasma, along the cylinder length in the direction of extent of the cylinder, as compared with the stationary electrode.

It is also conceivable, however, for the electrode arrangement to have a counter-electrode that surrounds the cylinder at a distance. In this case, a gas supply connected in a communicating manner to the interspace between the cylinder and the counter-electrode surrounding the cylinder, in order to route a gas stream into the interspace. Owing to the rotation of the cylinder carrying the at least one conductor path or conductor wire in the form of a spiral, a plasma is generated, virtually in the entire space between the cylinder surface and an adjacent inner wall of the counter-electrode, by the ignition sparks generated with a continuous change in location. Flowing through this space is the gas stream, which is ionized by the ignition sparks. There is thus generated, over a large area, a stream of plasma gas that flows out of the space between the cylinder and counter-electrode through which flow is effected. This stream of plasma gas does not have to be highly focused, as in the case of conventional plasma gas generation, and can be applied directly to a greater surface area without the necessity of spreading out a focused gas stream. This is due to the fact that the plasma is generated so as to vary in location in the gas stream, and consequently a greater volume of the stream of plasma gas can be ionized.

The counter-electrode in this case is preferably tubular and concentrically surrounds the cylinder carrying at least one electrode. It is also conceivable, however, for the counter-electrode to surround only a partial circumference of the cylinder. In another preferred embodiment, at least one rod electrode is disposed on a rotatable carrier element disposed about a rotation axis. The rod electrode in this case extends, in an offset manner in relation to the rotation axis, in a direction parallel to the rotation axis or at an acute angle in relation to the rotation axis. Whereas, in the case of the first embodiment, the at least one electrode acts at the circumference of a rotating cylinder, in the case of this embodiment the rod electrode is disposed at the end face of the rotatable carrier element. The rod electrode can thus act at the head of a handheld casing of the plasma treatment device, where it causes an ignition spark for generating plasma by means of a counter-electrode disposed adjacently to the free end of the rod electrode, when high-voltage potential is applied to the rod electrode. Owing to the rotation of the carrier element about a rotation axis, the tip of the rod electrode describes an orbit about the rotation axis. This orbit may be concentric in relation to the rotation axis, but need not necessarily be so. An elliptic orbit is also conceivable if there is a further motion, beyond the rotation about the rotation axis of the carrier element, superimposed on the rod electrode. It is particularly advantageous if the tip of the rod electrode is used as an active portion for generating the plasma ignition spark. For this purpose, a counter-electrode is then disposed adjacently to the tip of the at least one rod electrode. This counter-electrode may be either the surface of the object to be treated, which is preferably at frame potential. It is also conceivable, however, for the counter-electrode to be built into the plasma treatment device, as part of the electrode arrangement.

It is particularly advantageous if the counter-electrode is realized as a plate having a plurality of openings, the plurality of openings being disposed in a distributed manner on at least one orbit, which is matched, respectively, to the orbit of the tip of the at least one rod electrode. In the case of disposition of a plurality of rod electrodes, openings matched to the respective rod electrodes may be provided on differing orbits.

If the rod electrode is then rotated about the rotation axis of the carrier element, and the plate-type counter-electrode is disposed, approximately perpendicularly in relation to the rotation axis, adjacently to the tip of the at least one rod electrode, then, upon the rotational motion, the tip of the rod electrode will periodically be oriented onto one of the openings in the plate. Then, with a high voltage being continuously applied to the rod electrode, an ignition spark is generated when the tip of the rod electrode sweeps over the opening. This ignition spark is then extinguished again when the rod electrode is positioned closer to the electrically conductive material of the counter-electrode plate. Besides making it possible to dispense with ignition control electronics, this self-ignition by means of a rotating rod electrode also makes it possible to reduce the temperature of the stream of plasma gas that is generated.

For this self-ignition without additional control electronics, it is advantageous if the counter-electrode is composed of a dielectric material. The at least one rod electrode can then be supplied by means of a DC high-voltage source (direct voltage) or, preferably, by means of a high-frequency high-voltage source in the MHz range. In the case of a dielectric counter-electrode, the MHz high-voltage supply improves the self-ignition and ensures that the generated plasma is of a sufficiently low temperature not to affect a surface by the effect of temperature as the surface is being treated.

The plasma treatment device preferably has an electric, pneumatic or hydraulic drive unit, which is coupled directly to the at least one electrode, or to the cylinder or carrier element carrying the electrode, for the purpose of movement. The at least one electrode is thereby put into a rotational motion, for example by means of an electric motor, such that, by means of the drive unit, the plasma is generated so as to vary in location.

It is also conceivable, however, for the at least one electrode, or a cylinder or carrier element carrying the at least one electrode, to have a surface contour that is realized to drive the at least one electrode rotationally by routing a gas stream over the surface contour. The surface contour may have, for example, spiral depressions or protuberances. The gas stream flowing into the plasma treatment device, in which a plasma is generated by ionization by means of ignition sparks, and which then flows out of the plasma treatment device, as a stream of plasma gas, may be used as a gas stream. This gas stream is then routed along the surface contour, and thereby effects a rotational motion. Thus, for example, a cylinder carrying the at least one electrode, or a carrier element carrying the at least one electrode, may be designed as a drive element, by means of contouring, in order for the latter to be put into a rotational motion by the gas stream. There is then no longer a requirement for a separate drive unit. The plasma treatment device can thus be of a very simple and compact construction.

The plasma treatment device preferably has a handle, in which the electrode arrangement is integrated. The plasma treatment device may thus have, for example, a tubular casing, which serves as a casing for the electrode arrangement and constitutes the handle.

DESCRIPTION OF THE DRAWINGS

The invention is explained in greater detail in the following on the basis of exemplary embodiments, together with the appended drawings. These show.

DESCRIPTION

Figure 1:
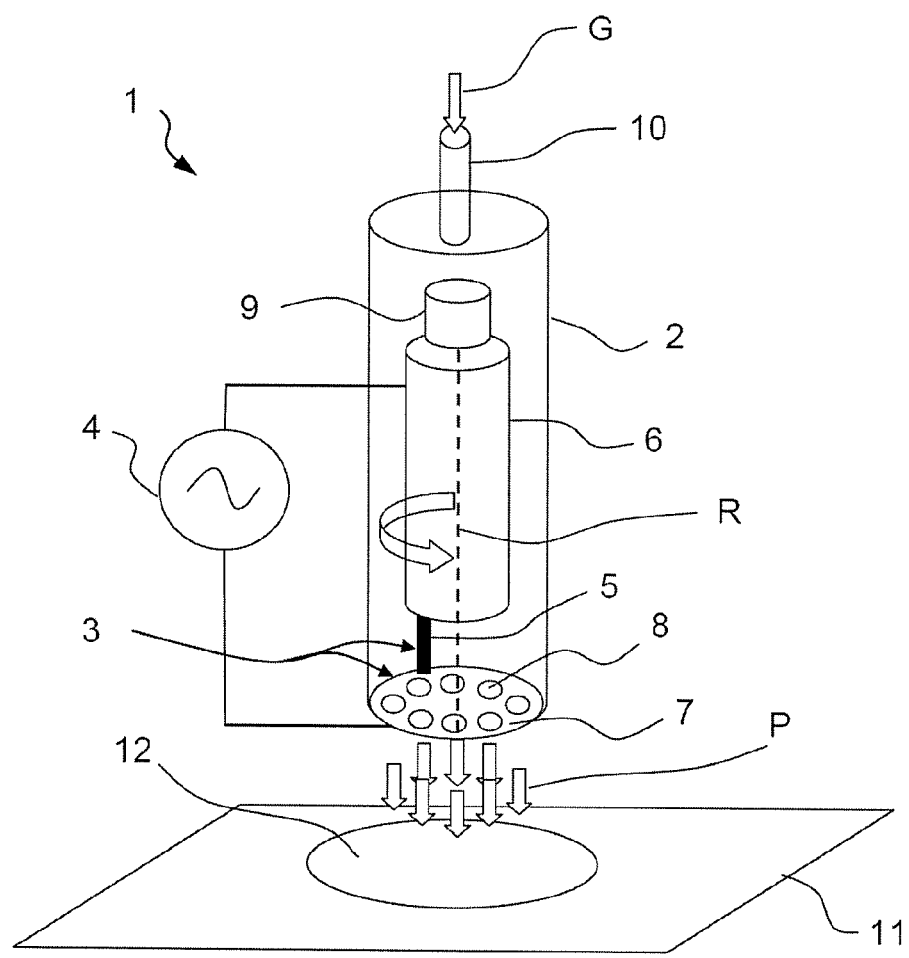
FIG. 1—Diagram of a first embodiment of a plasma treatment device, having a rotatable rod electrode.

FIG. 1 shows a diagram of a plasma treatment device 1, having a handheld casing 2. Built into the interior of the handheld casing 2 there is an electrode arrangement 3, which is supplied with a high voltage from a high-voltage source 4. The electrode arrangement 3 has a rod electrode 5, which is disposed at the end face of a rotatably disposed carrier element 6. The carrier element 6 is, for example, a cylinder, extending in a direction of longitudinal extent and having a circular end face at an end that carries the at least one rod electrode 5. A single rod electrode is represented. It is also conceivable, however, for two, three or more rod electrodes to be disposed at the end face. The at least one rod electrode 5 is connected in an electrically conducting manner to the high-voltage source 4 and, when in operation, is at high-voltage potential. Disposed adjacently to the free end of the at least one rod electrode 5 there is a counter-electrode 7, as part of the electrode arrangement 3. This counter-electrode is likewise connected to the high-voltage source 4, and is preferably at frame potential during operation. It can be seen that the plate-type counter-electrode 7 has openings 8 disposed in a distributed manner over an orbit. This orbit corresponds to the orbit of the tip of the rod electrode 5 when the latter moves about the rotation axis R of the carrier element 6 as a result of the rotation of the carrier element 6. In the exemplary embodiment represented, the at least one rod electrode 5 extends parallelwise in relation to the direction of extent of the rotation axis R. It is also conceivable, however, for the rod electrode 5 to be set obliquely thereto, and to be at an acute angle, preferably in the range of from 0 to 45 degrees, in relation to the rotation axis. The surface area that is swept by the at least one rod electrode 5 can thus be enlarged, if necessary, without enlarging the circumference of the carrier element 6.

The carrier element 6 is coupled to a drive unit 9. This drive unit 9 may be, for example, an electric motor. It is also conceivable, however, for the drive unit 9 to be a pneumatically operated motor. In this case, advantageously, a gas stream G, which is introduced into the plasma treatment device 1 and which flows out of the openings 8 of the counter-electrode 7, can be used.

Irrespective of the drive unit 9, in the exemplary embodiment represented the plasma treatment device 1 has a gas inlet 10 for letting in the gas stream G, which is then routed along the carrier element 6 to the region between the electrode arrangement 3. When the rod electrode 5 sweeps with its free end over the opening 8 in the counter-electrode 7, a respective ignition spark is then generated, which ionizes the gas stream and results in a stream of plasma gas. This stream of plasma gas P then emerges from the openings 8 of the counter-electrode 7 and is routed onto the surface 11 to be treated. With the plasma treatment device 1 kept constantly oriented onto the surface 11, or object, to be treated, a receiving treated surface area 12 is enlarged, as compared with a focused plasma beam. This is achieved by generating the stream of plasma gas P in a spread-out manner, which is effected by rotation of the rod electrode 5 in the direction of the arrow, about the rotation axis R, in that the ignition spark and the plasma are generated so as to vary in location.

Inert gases, air or the like are suitable for the gas stream G.

Figure 2:
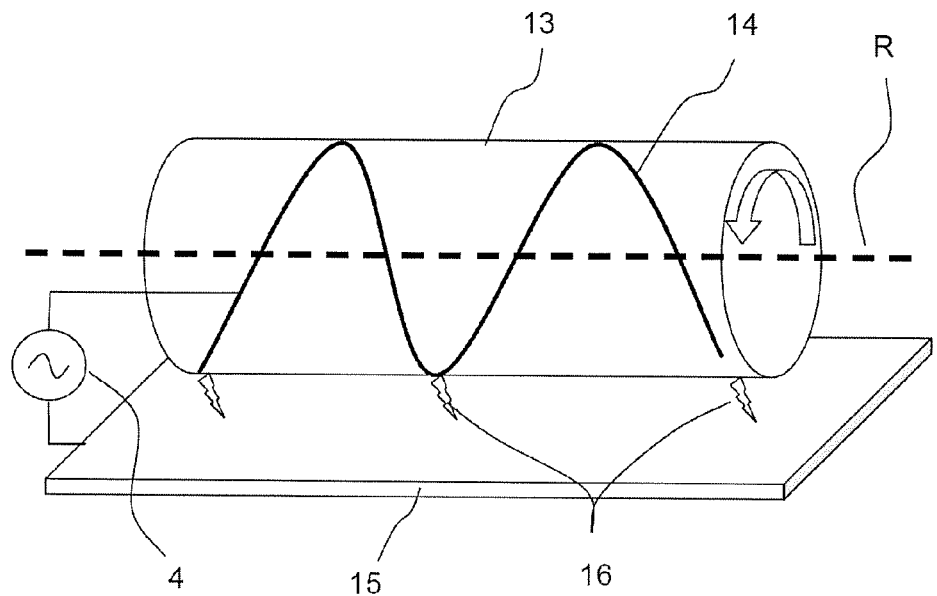
FIG. 2a—Diagram of a second embodiment of a plasma treatment device, having a spiral electrode on a rotatable cylinder, adjacent to a planar surface to be treated, as a counter-electrode, in a first position.
FIG. 2b—Diagram of a second embodiment of a plasma treatment device, having a spiral electrode on a rotatable cylinder, adjacent to a planar surface to be treated, as a counter-electrode, in a second position.
Figure 2:
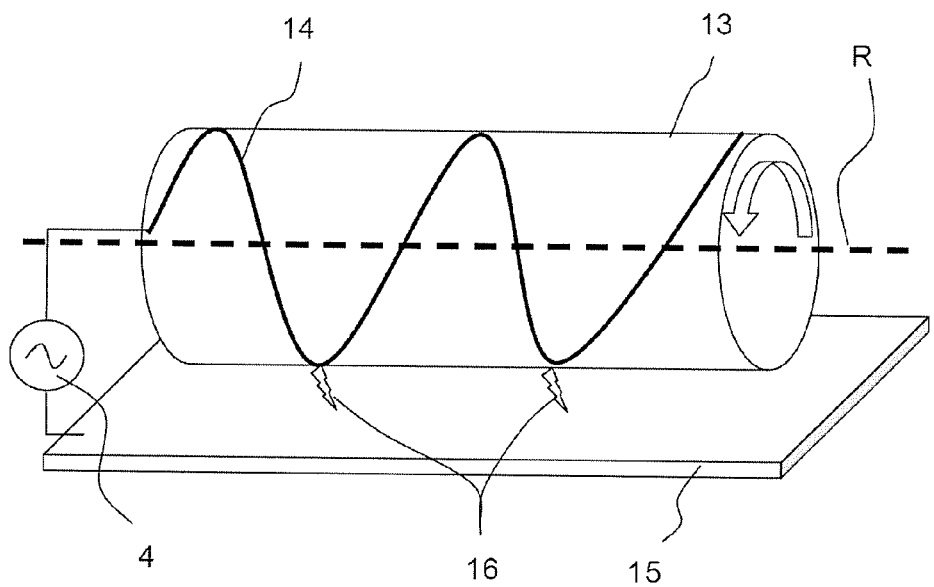

FIG. 2a shows a diagram of a second embodiment of a plasma treatment device 1, in a perspective arrangement. The plasma treatment device 1 has a rotatably disposed cylinder 13. On its surface, the cylinder 13 has electrodes 14, in the form of conductor paths or conductor wires, which go around the curved surface of the cylinder and which are wound around the cylinder 13. The at least one electrode 14 is again connected to a high-voltage source 4 and, when in operation, is at high-voltage potential. A plurality of electrodes 14, wound in the form of a spiral and disposed next to each other, may be electrically connected in parallel in this case.

The cylinder 13 is disposed adjacently to a, for example, plate-type counter-electrode 15, which is likewise connected to the high-voltage source 4 and is preferably at frame potential. The counter-electrode 15 may be, for example, the surface of the object to be treated. When high voltage is applied to the electrode 14, a respective ignition spark, and consequently a plasma, is generated at the regions of the spiral electrode path that is nearest to the surface to be treated, or to the counter-electrode 15.

If the cylinder 13 is now made to rotate slowly about the rotation axis R, new ignition sparks are then continuously produced at other locations, depending on the position of the regions of the electrode 14 that is nearest the counter-electrode 15. Owing to the spiral winding of the electrode around the cylinder surface, the ignition sparks thus move along the surface of the counter-electrode 15. Thus, with a constant orientation of the cylinder 13, or of the plasma treatment device 1, onto the surface to be treated, or onto the counter-electrode 15, the rotation of the cylinder 13 causes a plasma to be applied to a region over the length, in the direction of extent, of the cylinder 13.

Figure 3:
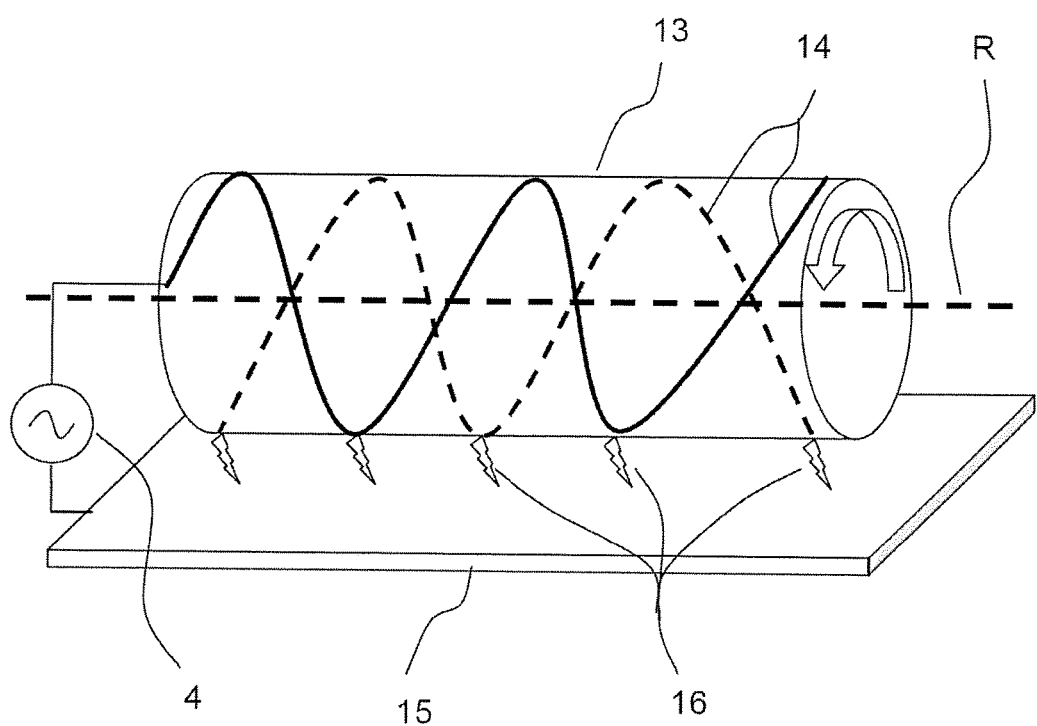
FIG. 3—Diagram of a second embodiment of a plasma treatment device, having a spiral electrode on a rotatable cylinder, adjacent to a planar surface to be treated, as a counter-electrode, at high rotational speed.

If the cylinder 13 is now put into a rapid rotational motion, as illustrated in FIG. 3, the ignition sparks 16 are generated over a relatively short time in virtually the entire space. Further ignition sparks are produced adjacently to the ignition spark generated a short time before, such that a plasma is applied virtually simultaneously to the surface of the object 15 to be treated, virtually over this entire effective length of the cylinder 13. During the treatment, the cylinder 13 can now be moved transversely in relation to the direction of longitudinal extent of the cylinder 13, in order thereby to treat a relatively large surface area with plasma in a short period of time. It is also conceivable for a plurality of devices to be connected next to each other (array connection), in order to treat an even greater surface area.

Figure 4:
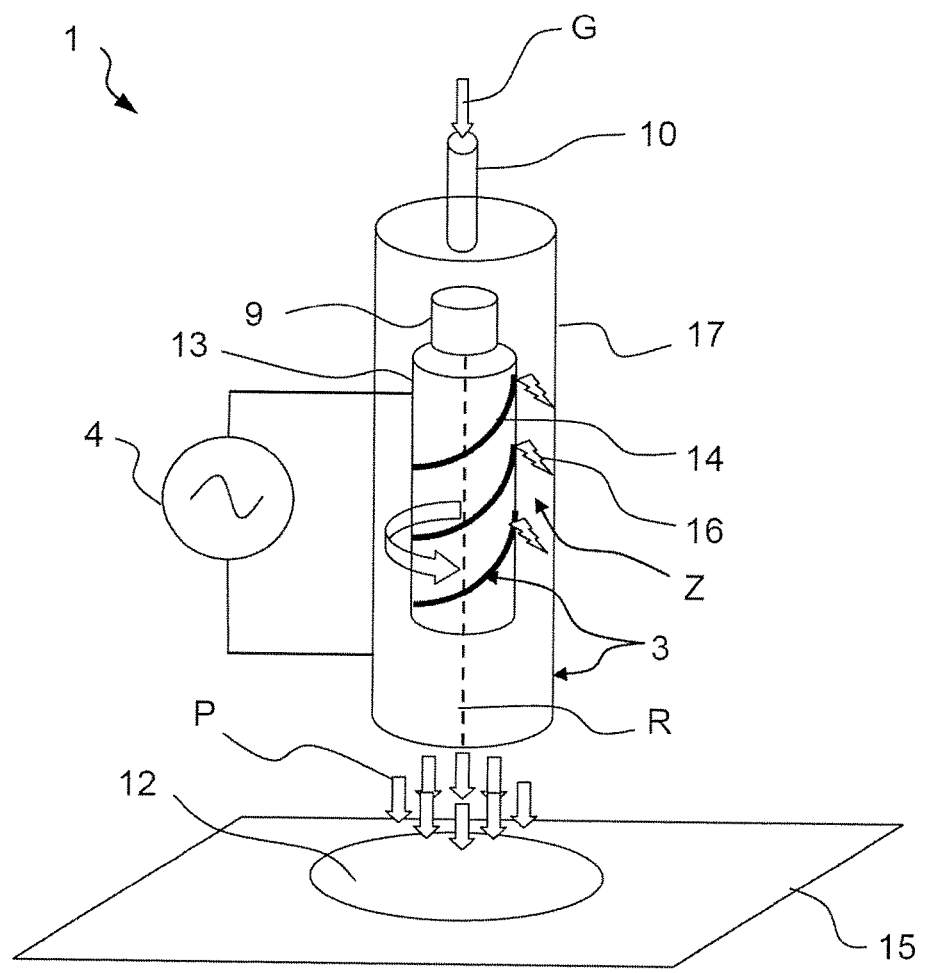
FIG. 4—Diagram of a third embodiment of a plasma treatment device, having a rotatable cylinder carrying a spiral electrode, having a surrounded tubular counter-electrode.

FIG. 4 shows a third embodiment of a plasma treatment device 1. The plasma treatment device 1 has an electrode arrangement 3, which is composed of at least one electrode 14, to which high voltage is applied during operation, and of a counter-electrode 17. As in the second exemplary embodiment, the at least one electrode 14 is again disposed so as to go around the surface of a rotatable cylinder 13. A cylinder is to be understood to mean, in principle, a carrier element, extending in a direction of main extent, having a curved or at least polygonal surface.

The counter-electrode 17 is a tubular entity concentrically surrounded the cylinder 13. The counter-electrode 17 is also connected in an electrically conducting manner to the voltage source 4, and is preferably at frame potential. As a result of high voltage being applied to the electrode 14, ignition sparks 16 are then generated between ignition regions of the electrode 14 and the nearest region of the inner wall of the counter-electrode 17. These ignition sparks 16 result in a plasma in a gas stream G, which is routed, through an inlet 10, into the interspace Z between the cylinder 13 and the inner wall of the counter-electrode 17. The resultant stream of plasma gas P is then routed out at the end-face outlet of the plasma treatment device 1. In this case, the tubular counter-electrode 17 may also simultaneously constitute the handheld casing. It is also conceivable, however, for the tubular counter-electrode 17 to be surrounded by a handheld casing, for example of plastic material, the stream of plasma gas P then emerging from the end face thereof.

Optionally, a more or less focused or additionally rotatable nozzle, for deflecting the stream of plasma gas P flowing out, may also be provided at the end-face outlet of the plasma treatment device 1.

The plasma treatment device 1 is then oriented onto the surface 15 to be treated, such that the stream of plasma gas is incident upon a surface area 12 treated with plasma.

The rotation of the electrodes 14 is preferably effected by a drive unit 9. The latter may be realized as an electric drive unit (for example, electric motor) or as a pneumatic or hydraulic drive unit. The drive unit 9 may thus be driven, for example, by means of the gas stream G that is supplied in any case.

In the case of the embodiments described, it is crucial that the electrodes 14 move, in order thus to generate the at least one ignition spark 16 and to generate the plasma, produced as a result of this, so as to vary in location. As a result of this, the effective plasma volume, or the effective plasma area, is enlarged, the position of the plasma treatment device 1 being otherwise constant. In the generation of plasma, therefore, the efficiency of the plasma treatment device is already increased by movement of the electrodes, and not just by variation of the location of the already generated stream of plasma gas.

The invention claimed is:

1. A plasma treatment device, comprising:
an electrode arrangement for generating a plasma;
said electrode arrangement comprising at least one movably mounted electrode which is a part of the electrode arrangement,
wherein the plasma can be generated so as to vary in location by means of movement of the at least one movably mounted electrode,
wherein the at least one movably mounted electrode is or includes at least one rod electrode disposed on a carrier element so as to be rotatable about a rotation axis,
wherein the rod electrode extends in an offset manner in relation to the rotation axis, in a direction parallel to the rotation axis, or at an acute angle in relation to the rotation axis, and
further comprising a counter-electrode disposed adjacent to a tip of the least one rod electrode,
wherein the counter-electrode is a plate having a plurality of openings disposed in a distributed manner on at least one orbit, which is matched, respectively, to the orbit of the tip of the at least one rod electrode.

2. The plasma treatment device according to claim 1, wherein the counter-electrode is dielectric or dielectrically shielded.

3. The plasma treatment device according to claim 1 further comprising an electric, pneumatic or hydraulic drive unit, which is coupled to the at least one movably mounted electrode, or to the cylinder or carrier element carrying the at least one movably mounted electrode for the purpose of moving the at least one movably mounted electrode.

4. The plasma treatment device according to claim 1 wherein the at least one movably mounted electrode, or a cylinder or carrier element carrying the at least one movably mounted electrode, has a surface contour that drives the at least one movably mounted electrode rotationally by routing a gas stream over the surface contour.

5. The plasma treatment device according to claim 1 further comprising a handle in which the electrode arrangement is integrated.

6. The plasma treatment device according to claim 1 wherein the plasma is a cold-atmospheric pressure plasma.

* * * * *